United States Patent [19]

Takahashi

[11] Patent Number: 4,901,131
[45] Date of Patent: Feb. 13, 1990

[54] CONDUCTIVITY MODULATED METAL OXIDE SEMICONDUCTOR FIELD EFFECT TRANSISTOR

[75] Inventor: Keiju Takahashi, Tokyo, Japan

[73] Assignee: NEC Corporation, Japan

[21] Appl. No.: 246,806

[22] Filed: Sep. 20, 1988

[30] Foreign Application Priority Data

Sep. 22, 1987 [JP] Japan ................................ 62-239601

[51] Int. Cl.⁴ .......................................... H01L 27/02
[52] U.S. Cl. ..................................... 357/43; 357/23.3; 357/23.4; 357/23.14
[58] Field of Search ....................... 357/43, 23.3, 23.4, 357/23.4

[56] References Cited

U.S. PATENT DOCUMENTS 4,830,973 5/1989 Mastroianni ........................... 357/43

Primary Examiner—Edward J. Wojciechowicz
Attorney, Agent, or Firm—Laff, Whitesel, Conte & Saret

[57] ABSTRACT

In a conductivity modulated MOS FET which is provided in a separating region between a semiconductor substrate of a conduction type and an epitaxial layer of a different conduction type grown on the semiconductor substrate, a first buried layer of the different conduction type and a second buried layer of the conduction type are on a boundary region between the semiconductor substrate and the epitaxial layer, and a drain region of the conduction type is in the epitaxial layer to be extended from the upper surface thereof to the bottom surface thereof, such that the drain region is in contact with the second buried layer which is separated from the semiconductor substrate. This structure allows the increase of drain current whereby the efficiency of area is improved.

2 Claims, 3 Drawing Sheets

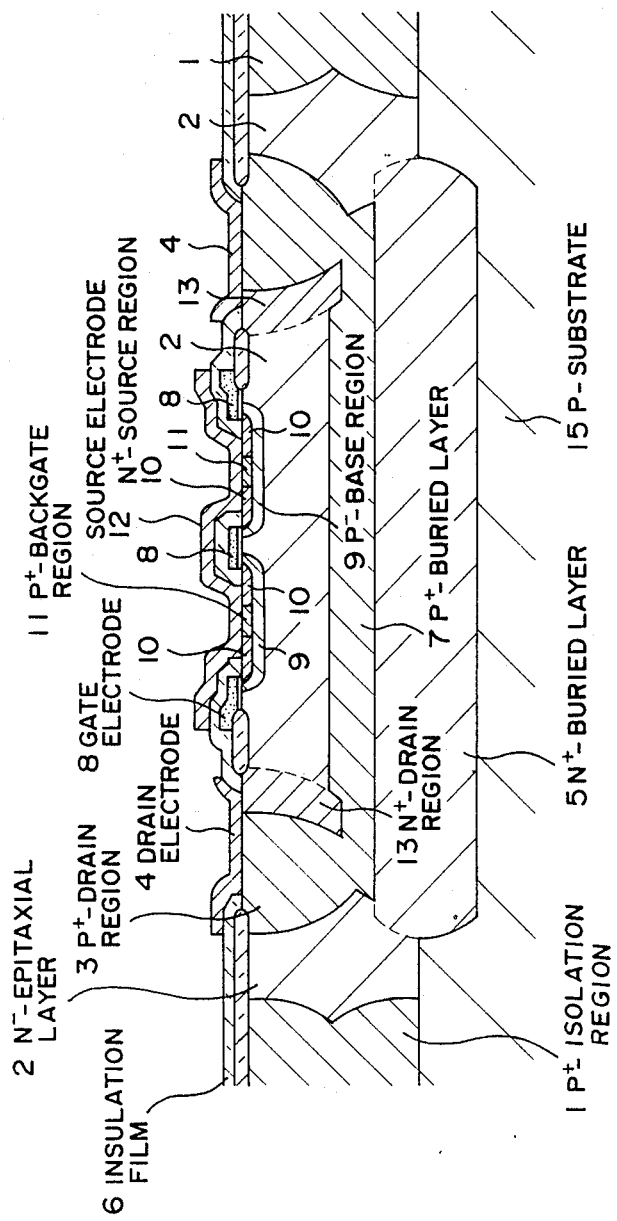

CONDUCTIVITY MODULATED METAL OXIDE SEMICONDUCTOR FIELD EFFECT TRANSISTOR

FIELD OF THE INVENTION

The invention relates to a metal oxide semiconductor field effect transistor (simply called "MOS FET" hereinafter), and more particularly to a conductivity modulated MOS FET of a lateral type in which drain and source electrodes are provided on the same plane of a semiconductor substrate.

BACKGROUND OF THE INVENTION

There has been widely used a conductivity modulated MOS FET of a lateral type inner semiconductor integrated circuit in which circuit elements are separated from the other by an isolation region. Although the conductivity modulated MOS FET will be explained in detail later, it comprises an island region of an N$^-$-epitaxial layer encircled on a P-substrate having an N$^+$-buried layer by a P$^+$-isolation region, a P$^+$-drain region and a P$^-$ base region respectively formed on the island region, an N$^+$-source region and a P$^+$-backgate region respectively formed on the P$^-$-base region, a polysilicon gate electrode provided on a gate insulation film formed on a peripheral edge of the P$^-$-base region, a drain electrode provided on the P$^+$-drain region, and a source electrode provided on the N$^+$-source region and the P$^+$-backgate region to be in contact therewith.

In the conductivity modulated MOS FET, when a positive voltage is applied to the gate electrode, a channel is formed on a surface of the P$^-$-base region so that a MOS FET including a source of the N$^+$-source region and a drain of the N$^-$-epitaxial layer operates. When the MOS FET is under a state of a conduction, the drain electrode is under the application of a positive voltage so that holes are injected from the P$^+$-drain region to the N$^-$-epitaxial layer, and a lateral bipolar transistor in which the P$^+$-drain region is an emitter, the N$^-$-epitaxial layer is a base, and the P$^-$-base region is a collector is turned on. The low-density drain region of the N$^-$-epitaxial layer is formed with a predetermined length to increase the withstand voltage between the drain electrode and the P$^-$-base region. For this structure, the P$^+$-drain region 3 is provided to decrease the drain resistance which is further decreased in accordance with the turning-on of the lateral bipolar transistor.

According to the conductivity modulated MOS FET, however, there is a disadvantage that the efficiency of area is not so high as expected for the reason why the drain electrode and the source electrode are provided on the same plane of the substrate, although the structure is suitable for the increase of integrated density in an integration circuit as compared to a conductivity modulated MOS FET in which a drain electrode and a source electrode are provided on the opposite planes of a semiconductor substrate.

SUMMARY OF THE INVENTION

Accordingly, it is an object of the invention to provide a conductivity modulated MOS FET in which a drain current per unit area is increased to improve the efficiency of area.

According to the invention, a conductivity modulated MOS FET is of a following structure. That is, on a semiconductor substrate of a conduction type, a high density buried layer of a different conduction type diffused with a material of a low diffusion coefficient such as antimony and a high density buried layer of the conduction type diffused with a material of a high diffusion coefficient such as boron are formed. An island region of the different conduction type epitaxial layer is grown on the high density buried layer of the conduction type. A high density drain region of the conduction type is provided in the epitaxial layer to be in contact with the high density buried layer of the conduction type, and a base region of the conduction type is provided on the epitaxial layer. A source region of the different conduction type is provided on the base region, and a gate electrode is provided on a gate insulation film formed on the base region.

BRIEF DESCRIPTION OF DRAWINGS

The invention will be explained in more detail in conjunction with appended drawings wherein, FIG. 3 is a cross sectional view showing a conductivity modulated MOS FET in a second embodiment according to the invention.

DESCRIPTION OF PREFERRED EMBODIMENTS

Figure 1:
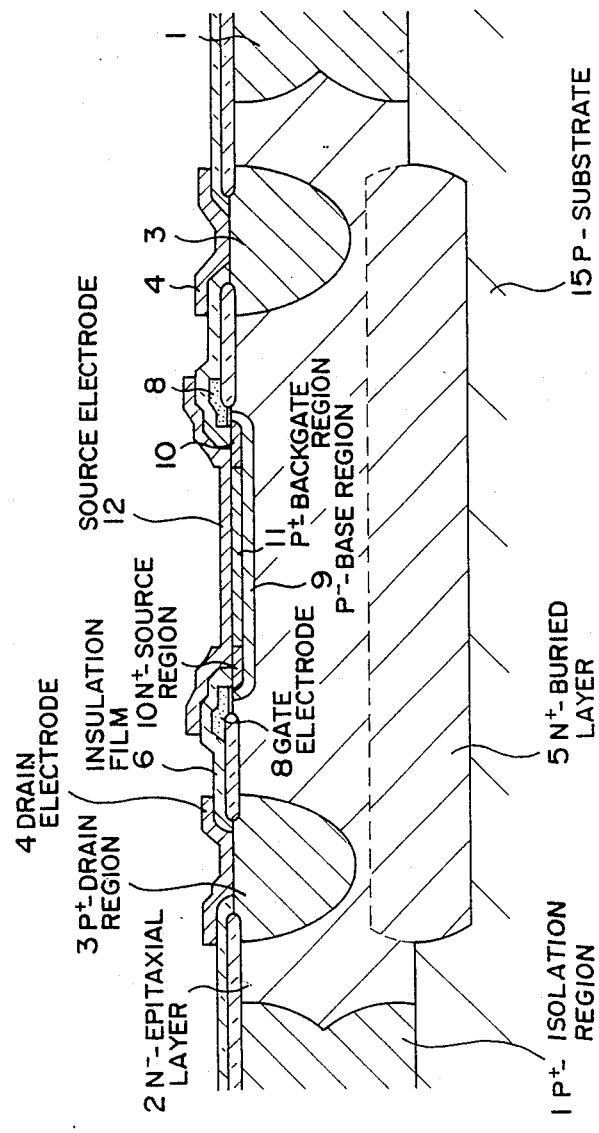
FIG. 1 is a cross sectional view showing a conventional conductivity modulated MOS FET.

Before explaining a conductivity modulated MOS FET in a first embodiment according to the invention, the aforementioned conductivity modulated MOS FET is explained in FIG. 1. In the conductivity modulated MOS FET, the island region of the N$^-$-epitaxial layer 2 is encircled on the P-semiconductor substrate 15 having the N$^+$-buried layer 5 by the P$^+$-isolation region 1. The P$^+$-drain region 3 and P$^-$-base region 9 are provided at the upper portion of the island region. On the P$^-$-base region 9, the N$^+$-source region 10 and the P$^+$-backgate region 11 are provided. The gate electrode 8 of polysilicon is provided on the gate insulation film formed on the peripheral edge of the P$^-$-base region 9. The drain electrode 4 is provided on the P$^+$-drain region 3, and the source electrode 12 is provided on the N$^+$-source region 10 and the P$^+$-backgate region 11 to be extended to an interfacial insulation film 6. Operation, advantage and disadvantage of the conductivity modulated MOS FET were explained before. Therefore, the explanations are not repeated here.

Figure 2:
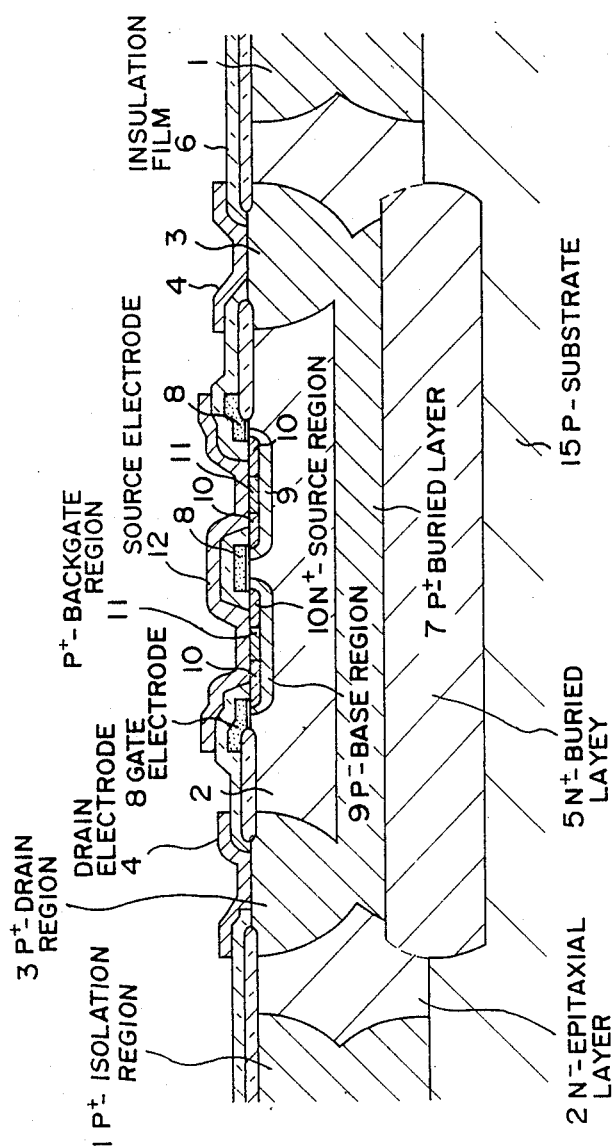
FIG. 2 is a cross sectional view showing a conductivity modulated MOS FET in a first embodiment according to the invention.

Next, a conductivity modulated MOS FET in the first embodiment according to the invention will be explained in FIG. 2. In the conductivity modulated MOS FET, an N$^+$-buried layer 5 including N-impurities of a low diffusion coefficient such as antimony by a high density and a P$^+$-buried layer 7 including P-impurities of a high diffusion coefficient such as boron by a high density are grown on a P-substrate 15 of Si. After that, an N$^-$-epitaxial layer 2 is grown on the buried layers 5 and 7, and then separated to provide plural island regions by P$^+$-isolation regions 1. Then, a circular P$^+$-drain region 3 is formed in the N$^-$-epitaxial layer 2 to be extended from the upper surface thereof, thereby being in contact with the P$+$-buried layer 7. At the upper portion of the N$^-$-epitaxial layer 2 on the inside of the circular P$^+$-drain region 3, there are formed plural P$^-$-base regions 9 like a grating pattern or dotted islands on each of which an N$^+$-source region 10 and P+-backgate region 11 are provided. Further, there is formed a gate electrode 8 on a gate insulation film provided across the surfaces of the epitaxial layer 2 and the N+-source layer 10. The surface of the gate electrode 8 is covered with an interfacial insulation film 6. A source electrode is provided to be in contact with the N+-source region 10 and the P+-backgate region 11, and a drain electrode 4 is provided on the P+-drain region 3 to be extended on the interfacial insulation film 6.

In operation, a MOS FET which is composed of the source region 10, the base region 9 and the epitaxial layer 2 is controlled to be turned on and off in accordance with a voltage applied to the gate electrode 8. When the MOS FET is turned on, a PN junction between the P+-drain region 3 and the N−-epitaxial layer 2 is under a forward bias so that holes which are of minority carriers are injected from the P+-drain region 3 to the N−-epitaxial layer 2. This causes the conductivity modulation in a lateral bipolar transistor which is composed of the P+-drain region 3, the N−-epitaxial layer 2, and the P−-base region 9. Consequently, the MOS FET in which a drain resistance is low is realized. In this occasion, the P+-buried layer 7 also operates as a drain region. For this reason, a large amount of drain current can be flowed in the MOS FET so that a conductivity modulated MOS FET in which the efficiency of area is high is obtained.

FIG. 3 shows a conductivity modulated MOS FET in a second embodiment according to the invention. Like parts of the conductivity modulated MOS FET are indicated by like reference numerals in FIG. 2 except for the difference in which an N+-drain region 13 is further diffused in the N−-epitaxial layer 2 by a predetermined depth. As shown in FIG. 3, the N+-drain region 13 is in contact with the inside wall of the circular P+-drain region 3 and is extended to the upper surface of the P+-buried layer 7.

In operation, the injection of holes is suppressed from the P+-drain region 3 to the N−-epitaxial layer 2 in accordance with the presence of the N+-drain region 13. Therefore, hHF (substantially equivalent to the current amplifying factor) of a MOS FET which is composed of the P+-drain region 3, the N+-drain region 13, the N−-epitaxial layer 2, and the P−-drain base region 9 is decreased down to as low as expected so that latch-up is suppressed and the life time of minority carriers is shortened in the N−-epitaxial layer 2 thereby shortening a turning-off duration.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A conductivity modulated MOS FET comprising,
   a semiconductor substrate of a conduction type,
   an epitaxial layer of a different conduction type grown on said semiconductor substrate,
   a first buried layer of said different conduction type which is on a partial upper surface of said semiconductor substrate, said first buried layer being in contact partly with said epitaxial layer,
   a second buried layer of said conduction type which is on a boundary region between said first buried layer and said epitaxial layer,
   a drain region of said conduction type which is in said epitaxial layer, said drain region extending from the upper surface of said epitaxial layer to the bottom surface thereof to be in contact with said second buried layer,
   a base region of said conduction type which is on a portion of said epitaxial layer, said portion being above said second buried layer,
   a source region which is on said base region, and
   a gate electrode which is on a gate insulation film, said insulation film being across the upper surfaces of said epitaxial layer and said source region.

2. A conductivity modulated MOS FET according to claim 1 further comprising,
   a drain region of said different conduction type which is in said epitaxial layer, said drain region of said different conduction type being in contact with a side surface of said drain region of said conduction type and extending from the upper surface of said epitaxial layer to the bottom surface thereof to be in contact with said second buried layer.

* * * * *